United States Patent [19]
Ito et al.

[11] Patent Number: 4,914,272
[45] Date of Patent: Apr. 3, 1990

[54] LASER BEAM SOLDERING APPARATUS AND SOLDERING METHOD USING THE SAME

[75] Inventors: Yujiro Ito; Takashi Otobe; Syunsuke Matsui, all of Kanagawa, Japan

[73] Assignee: Sony Corporation, Tokyo, Japan

[21] Appl. No.: 242,215

[22] Filed: Sep. 9, 1988

[30] Foreign Application Priority Data

Sep. 14, 1987 [JP] Japan .............................. 62-140529[U]
Sep. 14, 1987 [JP] Japan .................................. 62-230051

[51] Int. Cl.⁴ .............................................. B23K 26/00
[52] U.S. Cl. ........................... 219/121.63; 219/121.64; 219/121.76; 219/121.78; 219/85.12
[58] Field of Search ...................... 219/121.63, 121.64, 219/121.76, 121.78, 85 BM, 85 BA, 85.12

[56] References Cited

U.S. PATENT DOCUMENTS

3,586,816 6/1971 Hagen ........................ 219/121.64 X
4,785,156 11/1988 Benko et al. .................... 219/121.64

FOREIGN PATENT DOCUMENTS

0014489 1/1982 Japan .............................. 219/121.63
0192284 8/1987 Japan .............................. 219/121.76

*Primary Examiner*—C. L. Albritton
*Attorney, Agent, or Firm*—Hill, Van Santen, Steadman & Simpson

[57] ABSTRACT

A laser beam soldering apparatus is provided for soldering parts, such as, lead wires provided for an IC chip which are arranged closely to each other. The apparatus includes a plurality of laser beam irradiation units employing a semiconductor laser and a mounting dish for mounting the irradiation units. The dish has a plurality through holes for receiving the irradiation units. The irradiation units are mounted in the plate so as to be directed to one focal point to form a desired beam spot shape. A small beam spot having sufficient heat for soldering is thereby obtained.

13 Claims, 2 Drawing Sheets

LASER BEAM SOLDERING APPARATUS AND SOLDERING METHOD USING THE SAME

BACKGROUND OF THE INVENTION

The present invention relates generally to a soldering apparatus and soldering method using the same. More specifically, the invention relates to a soldering apparatus for soldering with a plurality of laser beams generated from laser beam oscillators employing semiconductor lasers.

There are YAG laser type and tungsten halogen lamp type soldering apparatuses put to practical use at present in soldering apparatuses employing a laser beam. The tungsten hologen lamp type soldering apparatus using a tungsten hologen lamp as a heat source transmits a laser beam having a beam spot diameter of 5 to 10 (mm). Such laser beam spot is too large for application in soldering printed boards. The YAG laser employs a laser beam as a heating beam and may be focused into a smaller spot. It will be appreciated that the YAG laser type soldering apparatus is available for soldering high density printed boards. Complete melting of solder with a YAG laser requires a large scale cooling system because only a small percentage of the electric energy is converted to beam energy. The size and cost of soldering apparatus employing a YAG laser therefore tend to be great.

Japanese Patent First Publication (tokkaisyo) No. 61-253170 exemplifies a conventional soldering apparatus employing a laser beam as a heat source. The application discloses that gas laser, semiconductor laser, solid-state laser, and excimer laser are available as a laser oscillators and the semiconductor laser has a relatively high conversion efficiency (15%) from electrical energy to beam energy. It will be noted that the semiconductor laser is very suitable for laser soldering apparatus. For these reasons, a YAG laser is generally used for a heat source. The output power of only one semiconductor laser is however too small to solder well and therefore more than one semiconductor laser is preferred. Moreover, in a high density printed circuit board within which an IC chip is disposed, lands, or portions to be soldered thereof are generally oblong and distances between the lands adjacent to each other are small. The shape of the YAG laser's beam spot is a circle. Thus, if the beam spot size of the laser beam is reduced smaller than the width of land, the laser beam is irradiated on only part of the land surface. The complete soldering of one lead wire requires displacement of a laser beam within the area to be irradiated in the longitudinal direction thereof. This results in extremely inefficient soldering. Depending on circumstances there are some cases where a plurality of spots are formed on a soldered portion. It will be appreciated that with soldering apparatus provided with only one laser beam, it is difficult to obtain fine solder connections. On the other hand, if the laser beam spot irradiated on the land is made relatively big so as to cover all surface thereof, a plurality of the lands get irradiated at the same time due to the small distances between the lead wires adjacent to each other, thereby causing a bridge of solder to be produced therebetween. It is therefore difficult for the oblong lands of a high density printed board to be efficiently soldered.

SUMMARY OF THE INVENTION

It is an object of the present invention to provide a laser beam soldering apparatus and soldering method for efficiently soldering which are separated by small distances without forming bridges of solder therebetween.

According to one aspect of the present invention, there is provided a soldering apparatus employing a laser beam comprising a plurality of laser beam irradiation units for irradiating a laser beam and means for providing a predetermined positional relationship among the laser units so as to focus a plurality of laser beams generated from the units onto a desired point.

According to another aspect of the present invention, there is provided a soldering apparatus employing a laser beam comprising a plurality of laser beam irradiation units for irradiating laser beams and means for mounting the laser beam units so as to focus a plurality of laser beams generated from the units onto a point in which the laser beam units arranged equidistant from the point.

According to still another aspect of the present invention, there is provided a soldering apparatus for soldering parts on a substrate by means of a plurality of laser beams, the parts having a plurality of lands to be soldered which are separated from each other by a predetermined distance, the apparatus comprising a plurality of laser beam irradiation units for focusing laser beams on the land, a curved mounting dish having a predetermined radius of curvature, and means, provided on the dish, for directing the laser beam irradiation units toward the land.

According to further aspect of the present invention, there is provided a process for soldering parts including a plurality of portions to be soldered, the portions being spaced at a predetermined distance, comprising the steps of providing a laser beam having a beam spot not wide enough to cover two of the portions at the same time, irradiating the laser beam onto one of the portions, and scanning the laser beam onto a portion to be soldered adjacent the soldered portion.

BRIEF DESCRIPTION OF THE DRAWINGS

The distinguishing features of the present invention are set forth in the appended claims. The invention together with its further objects and advantages thereof, may be best understood, however, by reference to the following description taken in conjunction with the accompanying drawings, in which like reference numerals identify like elements in the several figures and in which:

DESCRIPTION OF THE PREFERRED EMBODIMENTS

Figure 1:
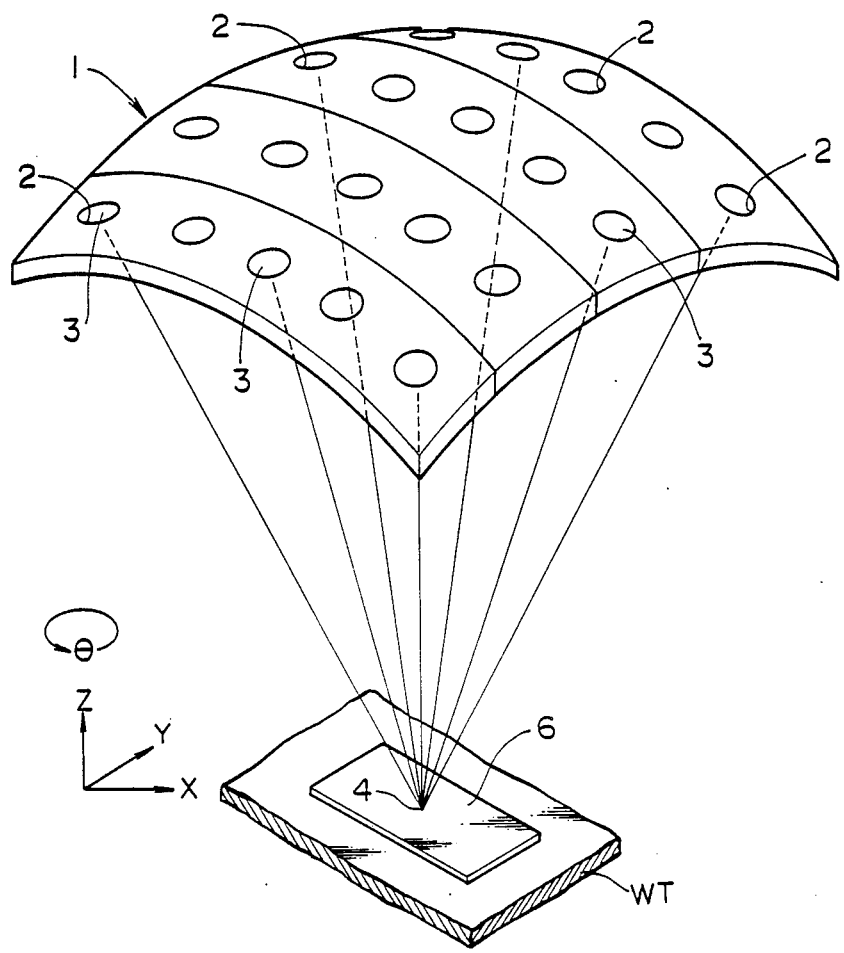
FIG. 1 is a schematic illustration which shows a laser beam soldering apparatus of the first embodiment.
Figure 2:
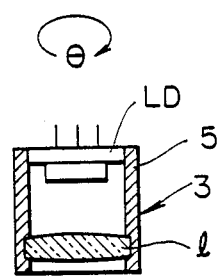
FIG. 2 is a sectional view which shows a laser beam irradiation unit employing a semiconductor laser.
Figure 3:
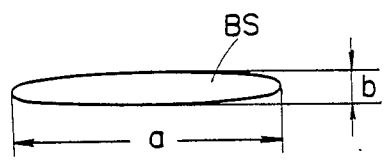
FIG. 3 is a plane view which shows a shape of beam spot to be irradiated from a laser beam irradiation unit.

Referring now to the drawings, in particular to FIGS. 1 to 3, there is shown a laser beam soldering apparatus of a first embodiment according to the present invention. The laser beam soldering apparatus includes a parabolic mounting dish 1 which has a 40 (mm) radius curvature and a plurality of laser beam irradiation units 3. Provided in the plate 1 is a plurality of mounting through holes 2 for receiving the laser beam units 3. Each of the through holes 2 are so formed that the axis thereof intersects the center of curvature 4 of the dish 1. Arrangement of the laser beam units 3 in the holes 2 is therefore effective to allow the laser beams propagated from the units to be focused at a single point. Each of laser beam irradiation units 3 comprise a high-powered laser diode LD, a focusing lens 1, and a cylindrical housing 5. The focusing lens 1 is fixed at one end of the housing 5 and the laser diode LD is installed at the other. The laser units 3 are disposed within the holes 2 and are equidistant from the focal point of the parabolic dish.

The laser beam irradiation unit 3 may preferably comprise a gradient index lens 2 (mm) in diameter and 2.6 (mm) in focal length and a laser diode LD. The near field pattern of the laser diode LD is 160 ($\mu$m)$\times$5($\mu$m). The laser beam units 3 are disposed within the through holes 2 so that the distances between the lenses and the focal point 4 is about 40 (mm). It will be appreciated that magnification of the lens system is about 40/2.6=15. Thus the beam emitted by the laser diode LD passing through the lens 1 is magnified 15 times at the focusing point 4 of the dish 1. Thus the dimensions of the beam spot BS of each of the respective units 3 at the focal point 4 approximately 2.4 (mm) in the major axis a and 0.075 (mm) in the minor axis b. The laser beam irradiation apparatus according to the first embodiment therefore provides a plurality of laser beams irradiating the focal point of the dish 1.

While aberration of the lens system may tend to cause the size of the beam spot to vary the influence on the size of the beam spot is small.

The laser diode LD provides output power of about 1 W and its efficiency of conversion from electrical energy to beam energy is about 15% greater than that of YAG laser. Since the shape of beam spot of the laser is not circular, adjustments of the orientation of the laser diode LD with respect to the direction ($\theta$) of orientation about the optical axis thereof are preferably made so as to make each of the laser beams irradiate the same place so that the beam spots completely overlap.

A table WT is provided on which a workpiece, such as a printed board, is loaded so that a portion to be heated thereof can be positioned at the focus point 4 of the parabolic dish. The table WT is movable in the direction of X (lateral direction), Y (longitudinal direction), Z (height direction), and $\theta$ (direction of rotation) relative to the parabolic dish 1.

A method of soldering with the above mentioned laser beam soldering apparatus will now be described hereinbelow.

Figure 4:
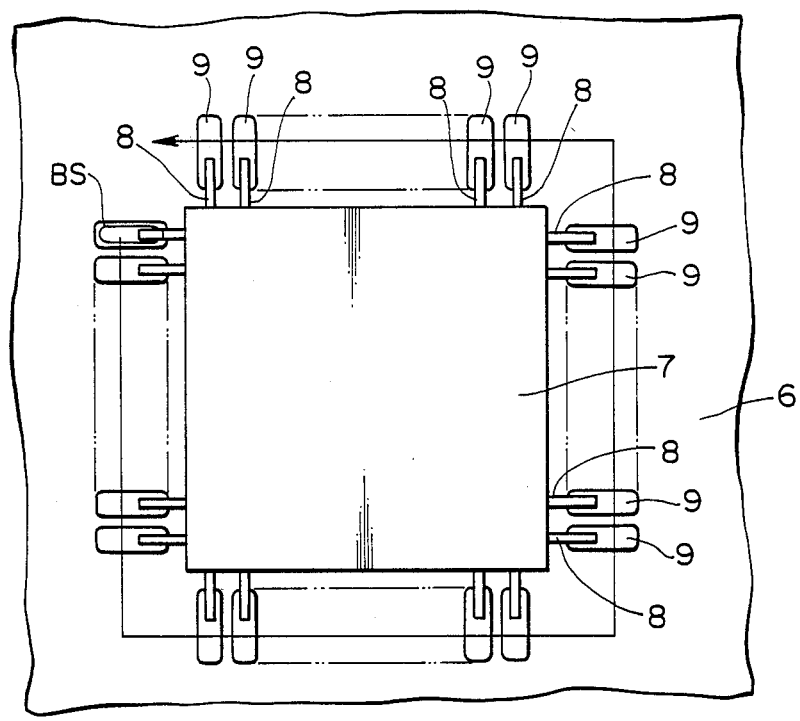
FIG. 4 is a plan view of a printed circuit board to be soldered by a soldering apparatus according to the present invention.

Referring to FIG. 4, there is illustrated an example of a printed circuit board to be soldered by the laser beam soldering apparatus of the present invention. The printed circuit board includes a printed board 6, a IC chip 7 to be installed thereon from which lead wires to be soldered within through holes in the printed board extend. Oblong lands 9 are provided on the printed board 6 to which the lead wires 8 are to be connected.

When soldering with the laser beam soldering apparatus, the printed circuit board is rotated relative to the dish to an orientation where the major axis of the oblong beam spot is parallel to that of the oblong lands 9. And the PC board is positioned so that the beam spot covers a land 9. The laser beam is then irradiated on a land 9 and solder provided thereon is melted so as to connect the lead wire 8 to the printed board 6. Upon finishing the above soldering process, the printed board 6 is moved at right angle to the major axis of the beam spot to the next land 9, which is then irradiated.

After soldering all lead wires 8 provided at one side of the IC chip 7, the table T is rotated 90 degrees in the direction indicated by the arrow and soldering of the next row of lands begins. Lead wires 8 provided at the next side are then soldered in sequence as in previous process. Thus, by repeating this soldering processes four cycles, all lead wires 8 of the IC 7 chip may be soldered.

Figure 5:
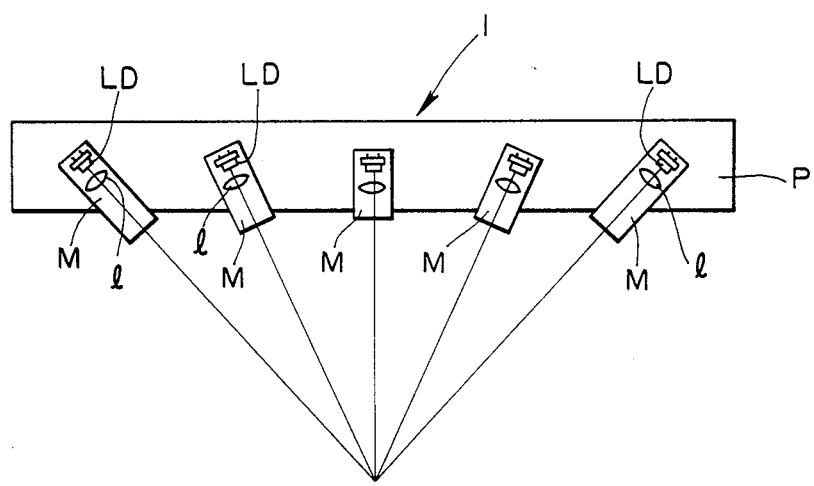
FIG. 5 is a schematic representation of a laser beam soldering apparatus of the second embodiment.

Referring to FIG. 5, there is shown a laser beam soldering apparatus of a second embodiment according to the present invention. The laser beam soldering apparatus is provided with a plurality of laser beam irradiation units M which are so arranged on a flat plate P that each of the laser beam units are directed toward a common focal point, that is, each of the laser beams are focused on the focal point. The laser beam irradiation unit includes a laser diode LD and a focusing lens 1. In the arrangement shown in FIG. 5, since the distance between the focal point and the respective laser beam units M is different focusing lenses having an optimal focal length should be provided for each laser beam units M. It will be appreciated that the laser beam soldering apparatus may produce laser beams providing a suitable beam spot and energy level for soldering a lead wire onto a printed board.

Consequently, according to the above described soldering process, there is no way that two soldering lands 9 adjacent to each other can get simultaneously become irradiated laser beam and become heated simultaneously so as to cause a solder bridge to be formed therebetween because the width b of the beam spot is 0.075 (mm) which is less than the distance between the adjacent lands 9. On the other hand, if the laser beam is irradiated onto the lands with the major axis of beam spot at right angles to that of land 9, two of the lands may become heated at the same time which may cause a bridge to form therebetween because the length of the major axis of the beam spot is 2.5 (mm) and is greater than the distance between the lands.

The laser beam soldering apparatus according to the invention directs laser beams emitted from respective laser diodes provided within the laser irradiation units on the focal point of a parabolic mounting dish in which the laser beam units are mounted to provide a small beam spot. Although the output power of the individual laser diodes provided within the respective units is small, the convergence of a plurality of laser beams produces sufficient heat to solder a lead wire to a printed circuit board. Moreover, the laser diode arrangement eliminates the need for a large scale power cooling system because of the conversion of efficiency from electrical energy to beam energy is high. According to the first embodiment, the laser beam irradiation units are equidistant from the focal point 4 of the dish 1 and therefore focusing lenses having the same focal length may be used in all of the laser beam irradiation units 3, reducing manufacturing cost.

While the laser beam soldering apparatus shown in FIGS. 1 and 5 are preferred embodiments according to the present invention, the invention is not restricted to the above embodiments. For example, by providing the laser beam irradiation units 3 with a focusing lens having a long focal length, the size of a beam at the center of the parabolic dish 4 spot can be increased without changing the working distance between the laser beam units 3 and the focal point of a laser beam transmitted thereby. Furthermore, while in the above embodiments, the orientations of the respective beam spots of the laser beams transmitted from the laser beam irradiation units 3 are adjusted so as to be directed onto the same oblong spot. A substantially circular beam spot may be produced by changing the orientation of the beam spots of the respective emitting units so as to differ from each other. It will be noted that a laser beam produced in such manner is suitable for spot welding. Further, the laser beam soldering apparatuses discussed as first and second embodiments may be also applicable to spot welding.

While a gradient index lens is used as a focusing lens in the above embodiments, spherical or spherical lenses may be applicable. However, focusing the laser beam transmitted from the laser diode LD onto a very small spot requires a high numerical aperture (NA) and a low aberration. The spherical lens therefore will require provision a doublet, triplet, or the spherical lens must be combined with three lenses or more.

While the present invention has been described in conjunction with specific embodiments thereof, it is evident that many alternatives, modifications and variations will be apparent to those skilled in the art. Accordingly, it is intended to embrace all alternatives, modifications, and variations that fall within the scope of the appended claims.

What is claimed is:

1. A soldering apparatus employing a laser beam comprising:
    a plurality of laser beam irradiation units for irradiating a laser beam; and
    means for providing a predetermined positional relationship among said laser units so as to focus a plurality of laser beams generated from said units onto a desired point, wherein said means defines a parabolic dish having a predetermined radius of curvature and includes a plurality of through openings for receiving said laser beam irradiation units, the axis of said openings intersecting said point.

2. An apparatus as set forth in claim 1, wherein each of said laser beams has an oblong beam spot.

3. An apparatus as set forth in claim 2, wherein said beam spots define a common longitudinal axis.

4. A soldering apparatus employing a laser beam comprising:
    a plurality of laser beam irradiation units for irradiating laser beams; and
    means for mounting said laser beam units so as to focus a plurality of laser beams generated from said units onto a point in which said laser beam units arranged equidistant from said point.

5. An apparatus as set forth in claim 4, wherein said means takes the form of a curved dish having a predetermined radius of curvature in which a plurality of openings are provided.

6. An apparatus as set forth in claim 5, wherein said laser beam irradiation units are disposed within said openings so as to be directed toward the focus of said curved dish.

7. A soldering apparatus for soldering parts on a substrate by means of a plurality of laser beams, said parts having a plurality of lands to be soldered which are separated from each other by a predetermined distance, the apparatus comprising:
    a plurality of laser beam irradiation units for focusing laser beams on the land;
    a curved mounting dish having a predetermined radius of curvature; and
    means, provided on said dish, for directing said laser beam irradiation units toward said land.

8. An apparatus as set forth in claim 7, wherein said laser beams irradiation units irradiate laser beams to provide a beam spot covering only a single land.

9. An apparatus as set forth in claim 7, wherein said means is defined by a plurality of openings through which said laser beam irradiation units are directed toward said land and the respective units are equidistant from the land.

10. An apparatus as set forth in claim 7, wherein said beam spot is not wider said predetermined distance.

11. A process for soldering parts including a plurality of portions to be soldered, said portions being spaced at a predetermined distance, comprising the steps of:
    providing a laser beam having a beam spot not wide enough to cover two of said portions at the same time;
    irradiating said laser beam onto one of said portions; and
    scanning said laser beam onto a portion to be soldered adjacent said soldered portion.

12. A process as set forth in claim 11, wherein said beam spot and portions respectively are oblong, said laser beams being irradiated onto the portion with the longitudinal axis of the beam spot parallel to that of said portion.

13. A process as set forth in claim 12, wherein said scanning is carried out in the direction perpendicular to said longitudinal direction.

* * * * *